(12) United States Patent
Kuan et al.

(10) Patent No.: US 12,006,460 B2
(45) Date of Patent: Jun. 11, 2024

(54) PHOTOELECTRIC CONVERSION COMPOUND AND PHOTOELECTRIC CONVERSION COMPOSITION INCLUDING THE SAME

(71) Applicant: INDUSTRIAL TECHNOLOGY RESEARCH INSTITUTE, Hsinchu (TW)

(72) Inventors: Min-Tsung Kuan, Taichung (TW); Wen-Hsien Wang, Tainan (TW); Yi-Chang Du, Houlong Township (TW); Szu-Lin Wang, Hsinchu (TW); Wen-Hsien Chou, Lunbei Township (TW); Hsin-Hsin Hsieh, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 295 days.

(21) Appl. No.: 17/565,946

(22) Filed: Dec. 30, 2021

(65) Prior Publication Data

US 2023/0212455 A1    Jul. 6, 2023

(51) Int. Cl.
| C09K 11/77 | (2006.01) |
| C08G 63/82 | (2006.01) |
| C08K 3/013 | (2018.01) |
| C08K 3/22  | (2006.01) |
| H01L 33/50 | (2010.01) |

(52) U.S. Cl.
CPC ........ *C09K 11/7792* (2013.01); *C08G 63/823* (2013.01); *C08K 3/013* (2018.01); *C08K 3/22* (2013.01); *H01L 33/502* (2013.01); *C08K 2003/2227* (2013.01)

(58) Field of Classification Search
CPC ...... C09K 11/7792; C08K 3/031; C08K 3/22; C08K 2003/2227; C08G 63/823
See application file for complete search history.

(56) References Cited

U.S. PATENT DOCUMENTS

| 5,447,576 A | 9/1995 | Willis |
| 5,686,022 A | 11/1997 | Murayama et al. |
| 6,093,757 A | 7/2000 | Pern |
| 7,368,655 B2 | 5/2008 | Blieske et al. |
| 7,504,046 B2 * | 3/2009 | Zhang ............... C09K 11/025 |
| | | 252/301.36 |
| 8,465,675 B2 | 8/2013 | Kuan et al. |
| 8,860,165 B2 | 10/2014 | Okaniwa et al. |
| 9,705,020 B2 | 7/2017 | Kuan et al. |

| 2014/0217445 A1 * | 8/2014 | Jansen ................ C09K 11/025 |
| | | 252/301.36 |
| 2015/0047703 A1 * | 2/2015 | Sawaki ............ C09K 11/7789 |
| | | 252/301.36 |
| 2019/0375957 A1 * | 12/2019 | Hasegawa ............... H01L 33/06 |
| 2020/0098940 A1 | 3/2020 | Kuan et al. |

FOREIGN PATENT DOCUMENTS

| CN | 1718671 A  * | 1/2006 | ............ C09K 11/80 |
| CN | 1949544 A | 4/2007 | |
| CN | 1887942 B | 10/2010 | |
| CN | 102544148 A | 7/2012 | |
| CN | 103384920 A | 11/2013 | |
| CN | 103578385 A | 2/2014 | |
| CN | 105226121 A | 1/2016 | |
| CN | 105694863 A | 6/2016 | |
| CN | 105733457 A | 7/2016 | |
| CN | 105869894 B | 6/2018 | |
| CN | 106062131 A | 10/2018 | |
| CN | 108091717 B | 1/2019 | |
| CN | 111621236 A | 9/2020 | |
| JP | 2000-183382 A | 6/2000 | |
| JP | 2003-218379 A | 7/2003 | |
| JP | 2004-221119 A | 8/2004 | |
| JP | 2006-179626 A | 7/2006 | |

(Continued)

OTHER PUBLICATIONS

Jia et al. "Biodegradable long-persistent luminescent films based on PHB/PHBV as matrix and sunlight conversion applications", J. Macromolecular Science, Part A: Pure and Applied Chemistry, 2020, vol. 57, No. 4, 291-298. Published online Nov. 19, 2019 (Year: 2019).*

(Continued)

*Primary Examiner* — Jane L Stanley
(74) *Attorney, Agent, or Firm* — Birch, Stewart, Kolasch & Birch, LLP

(57) ABSTRACT

A photoelectric conversion compound is provided. The photoelectric conversion compound has a structure represented by formula (I):

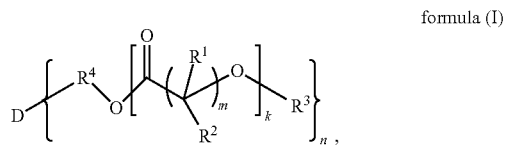

formula (I)

wherein D represents an inorganic luminescent group; each of $R^1$, $R^2$, and $R^3$ independently represents a hydrogen atom or a $C_{1-6}$ alkyl group; $R^4$ represents a single bond or a $C_{1-6}$ alkylene group; m represents an integer of 1-10; k represents an integer of 1-1,000; and n represents an integer of 1-10,000.

8 Claims, 7 Drawing Sheets

(56) References Cited

FOREIGN PATENT DOCUMENTS

| | | | | |
|---|---|---|---|---|
| RU | 2014105290 A | * | 8/2015 | ............... C08F 2/44 |
| TW | I555819 B | | 11/2016 | |
| WO | WO 2006/093936 A2 | | 9/2006 | |
| WO | WO-2016020337 A1 | * | 2/2016 | ............... A01G 9/14 |

OTHER PUBLICATIONS

Hanna M. Abumelha "Simple production of photoluminescent polyester coating using lanthanide-doped pigment", Luminescence, 2021; 36; 1024-1031. Published Feb. 11, 2021 (Year: 2021).*

Taiwanese Office Action and Search Report for Taiwanese Application No. 110149581, dated Jun. 28, 2022.

Long et al., "Research on Improving Utilization Efficiency of Photoelectric Cell By Using Fluorescence Material," Proceedings of ISES World Congress 2007, pp. 1103-1106, 4 pages total.

* cited by examiner

PHOTOELECTRIC CONVERSION COMPOUND AND PHOTOELECTRIC CONVERSION COMPOSITION INCLUDING THE SAME

TECHNICAL FIELD

The technical field relates to a photoelectric conversion compound and a photoelectric conversion composition including the same.

BACKGROUND

The first solar cell was manufactured by Bell Labs, U.S.A., in 1954, and it was used to provide electricity for remote communication systems. However, that solar cell design lacked commercial value due to its low light conversion efficiency (only about 6%) and high cost (375 U.S. dollars per watt). Many improvements have been made by those skilled in art over the years, but problems such as low conversion efficiency, high cost, and short operating life continue to plague designers.

In order to further improve the light conversion efficiency of solar cells, solar cells encapsulated after coating a layer of fluorescent dyes on the outside of a glass substrate, or solar cells including packaging materials made from directly mixing inorganic fluorescent dyes that are microencapsulation or milled into nanoparticles with resin materials have been proposed.

However, the inorganic fluorescent dyes used have poor water resistance and inorganic fluorescent dyes that have been microencapsulated or milled into nanoparticles may not be uniformly dispersed in the resin materials. These drawbacks can lead to reduced reliability and service life of the solar cells.

Therefore, there is still a desire for a solar cell having an improved electrical gain effect, reliability and service life and the ability to emit light at low illumination and at night.

SUMMARY

The present disclosure provides a photoelectric conversion compound. According to embodiments of the disclosure, the photoelectric conversion compound has the structure shown in Formula (I):

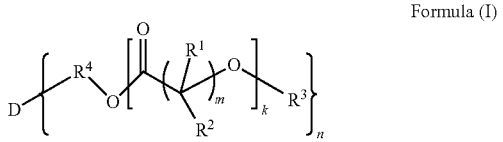

Formula (I)

wherein D represents an inorganic luminescent group; each of $R^1$, $R^2$, and $R^3$ independently represents a hydrogen atom or a $C_{1-6}$ alkyl group; $R^4$ represents a single bond or a $C_{1-6}$ alkylene group; m represents an integer of 1-10; k represents an integer of 1-1,000; and n represents an integer of 1-10,000.

According to embodiments of the disclosure, the present disclosure provides some embodiments related to a photoelectric conversion composition including the above photoelectric conversion compound.

In order to make the features and benefits of the embodiments of the present disclosure more apparent and understandable, the disclosure is described in detail below with the accompanying drawings.

BRIEF DESCRIPTION OF DRAWINGS

Exemplary embodiments of the present disclosure are described in detail below with reference to the accompanying drawings, wherein.

DETAILED DESCRIPTION

Figure 1:
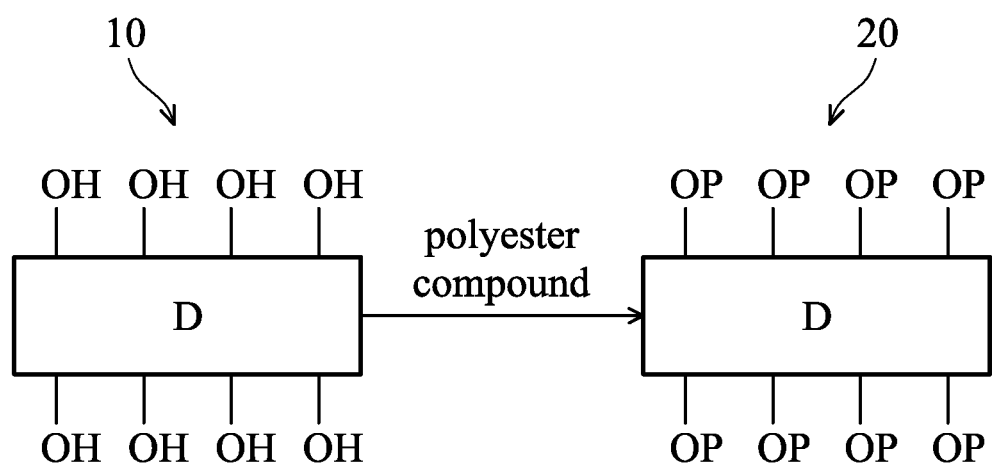
FIG. 1 illustrates a schematic diagram of the preparation of a photoelectric conversion compound according to some embodiments of the present disclosure.

The following is a detailed description of the components of some embodiments of the present disclosure. It should be understood that the following description provides many different embodiments or examples for implementing different embodiments of the present disclosure. The particular components and arrangements described below are intended only to briefly and clearly describe some embodiments of the present disclosure. These are intended to be examples only and not limitations of the present disclosure. In addition, the present disclosure may repeat reference numerals and/or letters in the various examples. This repetition is for the purpose of simplicity and clarity and does not in itself dictate a relationship between the various embodiments and/or configurations discussed.

Here, the terms "about", "approximately", "substantially" usually means within 20%, within 10%, within 5%, within 3%, within 2%, within 1% or within 0.5% of a given value or range. Here, the given value is an approximate number. That is, in the absence of a specific description of "about", "approximately", "substantially", the meaning of "about", "approximately", "substantially" may still be implied.

Here, the term "shorter than or equal to" indicates a range that contains a given value and values below that given value, and the term "longer than or equal to" indicates a range that contains a given value and values above that given value. Conversely, the term "shorter than" indicates a range that contains values shorter than a given value but does not contain that given value, and the term "longer than" indicates a range that contains values more than a given value but does not contain that given value. For example, "longer than or equal to a" means a range including values of a and values above a, and "longer than a" means a range including values more than a but not including a. Here, the term "between a and b" is used to include a, b, and any values between a and b.

Unless defined otherwise, all technical and scientific terms used herein have the same meaning as commonly understood by one of ordinary skills in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

The present disclosure provides some embodiments that relate to a photoelectric conversion compound, the photoelectric conversion compound containing an inorganic luminescent group and a polyester unit grafted to the inorganic luminescent group. FIG. 1 illustrates a schematic diagram of a preparation of a photoelectric conversion compound 20 according to some embodiments of the present disclosure.

As shown in FIG. 1, an inorganic luminescent dye 10 has several hydroxyl groups (—OH) on the surface thereof. A polyester compound may have at least one polyester unit P. By carrying out a grafting reaction of the polyester compound and the inorganic luminescent dye 10, at least one polyester unit P of the polyester compound may be grafted onto the inorganic luminescent group D of the inorganic luminescent dye 10 through the oxygen atom of the hydroxyl group so as to form a photoelectric conversion compound 20 which has a high water resistance and a melting point between 30 and 180° C. In an embodiment, the photoelectric conversion compound 20 has a melting point between 40 and 150° C. In another embodiment, the photoelectric conversion compound 20 has a melting point between 50 and 130° C. When the melting point of the photoelectric conversion compound is in the above range, the photoelectric conversion compound 20 has a property of being easily mixed with a resin.

In an embodiment, the polyester unit P may have a structure as shown in Formula (I-1) below.

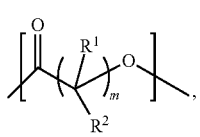

Formula (I-1)

wherein each of $R^1$ and $R^2$ independently represents a hydrogen atom or a $C_{1-6}$ alkyl group and m represents an integer of 1-10. In an embodiment, m represents a positive integer of 1-5. In an embodiment, each of $R^1$ and $R^2$ independently represents a hydrogen atom or a methyl group. In an embodiment, the polyester compound may comprise a polycaprolactone (PCL), and the polyester unit P may be a polyester unit of the polycaprolactone having the structure shown below.

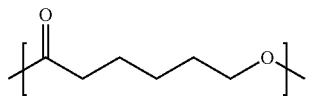

In an embodiment, the inorganic luminescent group D has the ability to absorb light with a wavelength shorter than or equal to 400 nm and emit light with a wavelength longer than or equal to 400 nm. In an embodiment, the inorganic luminescent group D may comprise $CaAl_2O_4$:Eu,Nd, $Sr_4Al_{14}O_{25}$:Eu,Dy, or $SrAl_2O_4$:Eu,Dy. In an embodiment, the inorganic luminescent group D is $SrAl_2O_4$:Eu,Dy.

In an embodiment, the inorganic luminescent dye has n alkanol groups (—$R^4$OH) on the surface thereof. The photoelectric conversion compound has a structure as shown in Formula (I):

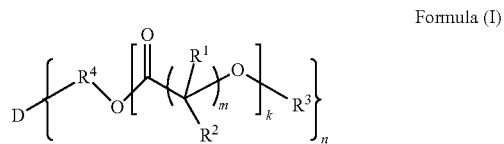

Formula (I)

wherein D represents an inorganic luminescent group; each of $R^1$, $R^2$, and $R^3$ independently represents a hydrogen atom or a $C_{1-6}$ alkyl group; $R^4$ represents a single bond or a $C_{1-6}$ alkylene group; m represents an integer of 1-10; k represents an integer of 1-1,000; and n represents an integer of 1-10,000.

The term "$C_{1-6}$ alkyl group" used herein refers to a straight or branched aliphatic hydrocarbon monovalent group having 1 to 6 carbon atoms in the main carbon chain thereof, and non-limiting examples thereof comprise, but not limited to, a methyl group, an ethyl group, a propyl group, an isobutyl group, a sec-butyl group, a tert-butyl group, a pentyl group, an isopentyl group, and a hexyl group. The term "$C_{1-6}$ alkylene group" used herein refers to a divalent group having the same structure as $C_{1-6}$ alkyl group. Non-limiting examples of the $C_{1-6}$ alkylene group comprise, but not limited to, a methylene group, an ethylene group, a propylene group, an isobutylene group, a sec-butylene group, a tert-butylene group, a pentylene group, an isopentylene group, and a hexylene group.

In an embodiment, the photoelectric conversion compound has a refractive index between 1 and 2. In an embodiment, the photoelectric conversion compound has a refractive index between 1.3 and 1.8. In another embodiment, the photoelectric conversion compound has a refractive index between 1.2 and 1.5. When the refractive index of the photoelectric conversion compound is in the above range, the photoelectric conversion compound will have high transmittance.

The present disclosure provides some other embodiments related to a photoelectric conversion composition comprising a photoelectric conversion compound as described above. In some embodiments, the photoelectric conversion composition may further comprise a transparent resin. With the polyester units grafted on the inorganic luminescent groups, the photoelectric conversion compound of the present disclosure may be uniformly dispersed in the transparent resin.

In an embodiment, the transparent resin may comprise a hydrogenated styrene elastomer resin, an acrylate elastomer resin, an ethylene vinyl acetate copolymer (EVA), or a combination thereof.

The hydrogenated styrene elastomer resin may comprise di-block or tri-block hydrogenated styrene-based resins. Examples of the di-block hydrogenated styrene-based resins or the tri-block hydrogenated styrene-based resins comprise, but not limited to, hydrogenated (styrene-isoprene) diblock copolymers, hydrogenated (styrene-isoprene-styrene) tri-block copolymers, hydrogenated (styrene-butadiene-styrene) triblock copolymers, hydrogenated (styrene-isoprene/butadiene-styrene) triblock copolymers, hydrogenated (styrene-ethylene branched isoprene) diblock copolymers, or a combination thereof.

The acrylate elastomer resin may comprise diblock acrylic-based resin or triblock acrylic-based resin. Examples of the diblock acrylic-based resin or the triblock acrylic-based resin comprise, but not limited to, (methylmethacrylate-isoprene) diblock copolymers, (methylmethacrylate-butadiene) diblock copolymers, (methylmethacrylate-isoprene-methylmethacrylate) triblock copolymers, (methylmethacrylate-butadiene-methylmethacrylate) triblock copolymers, (methylmethacrylate-isoprene/butadiene-methylmethacrylate) triblock copolymers, (methylmethacrylate-ethylene branched isoprene) diblock copolymers, or a combination thereof.

In some embodiments, the photoelectric conversion composition may further comprise an additive. Examples of the additives may comprise, but not limited to, hardening initiators, antioxidants, bridging agents, stabilizers, or a combination thereof.

The hardening initiators may harden the photoelectric conversion composition. Examples of the hardening initiators may include, but not limited to, photo-hardening initiators, thermosetting initiators, or a combination thereof.

The antioxidants may prevent the photoelectric conversion composition form yellowing or may improve the processability of the photoelectric conversion composition. Examples of the antioxidants may comprise, but not limited to, dibutyl hydroxytoluene (BHT), bis(2,2,6,6-tetramethyl-4-piperidinyl) sebacate, diphenylketone, derivatives thereof, or a combination thereof.

The bridging agents can improve the heat resistance, weather resistance, solvent resistance, or corrosion resistance of the photoelectric conversion composition. Examples of the bridging agents may comprise, but not limited to, isocyanate bridging agents, epoxy bridging agents, amine bridging agents, melamine bridging agents, aziridine bridging agents, hydrazine bridging agents, aldehyde bridging agents, oxazoline bridging agents, metal alkoxide bridging agents, metal chelate bridging agents, metal salt bridging agents, ammonium bridging agents, or a combination thereof.

The stabilizer may improve the durability of the photoelectric conversion composition. Examples of the stabilizers may comprise, but not limited to, photostabilizers, thermostabilizers, or a combination thereof.

Specific examples and comparative examples are provided below to further illustrate the advantages of the presently disclosed photoelectric conversion compound and the photoelectric conversion composition comprising the same.

Synthesis Example 1

15.0623 g of an inorganic luminescent dye 1 (Nemoto Specialty Chemicals Co., Ltd., Model No. GLL-300F) was added to a 250 ml reaction vial and stirred at 100.0 rpm., 75.6399 g of caprolactone (CL) (Daicel Corporation, Model No. CLM-DK-051) was added in batches while stirring to obtain a mixture. 0.15 g of dibutyltin dilaurate (Wako Pure Pharmaceuticals Co. Ltd., Model No. PD4728) was added to the mixture as catalysts, the temperature of the mixture was increased to 110-125° C. and the temperature was maintained for 22 hours. After completing the reaction above, the mixture was continuous stirred at 100.0 rpm and the temperature of the mixture was cooled to 60° C. to obtain a crude product.

500 ml of 95% ethanol was dropwise into the resulting crude product to re-precipitate and thereby wash the resulting crude product. The precipitate was filtered through a magnetic funnel and the filtered product was washed with 100 ml of 95% ethanol. The filtered product was dried in a vacuum oven at 50° C. for 4 h. 83.7 g (93% yield) of photoelectric conversion compound 1 (GLL300FS-PCL) was obtained as a final product.

Synthesis Example 2

Except to use an inorganic luminescent dye 2 (Nemoto Specialty Chemicals Co., Ltd., Model No. GLL-300FF) instead of the inorganic luminescent dye 1, 81.45 g (91.5% yield) of the photoelectric conversion compound 2 (GLL300FF-PCL) was obtained in the same manner as that in Synthesis Example 1.

Performance Evaluation of Photoelectric Conversion Compound

1. Evaluation of Luminescence Properties

Figure 2A:
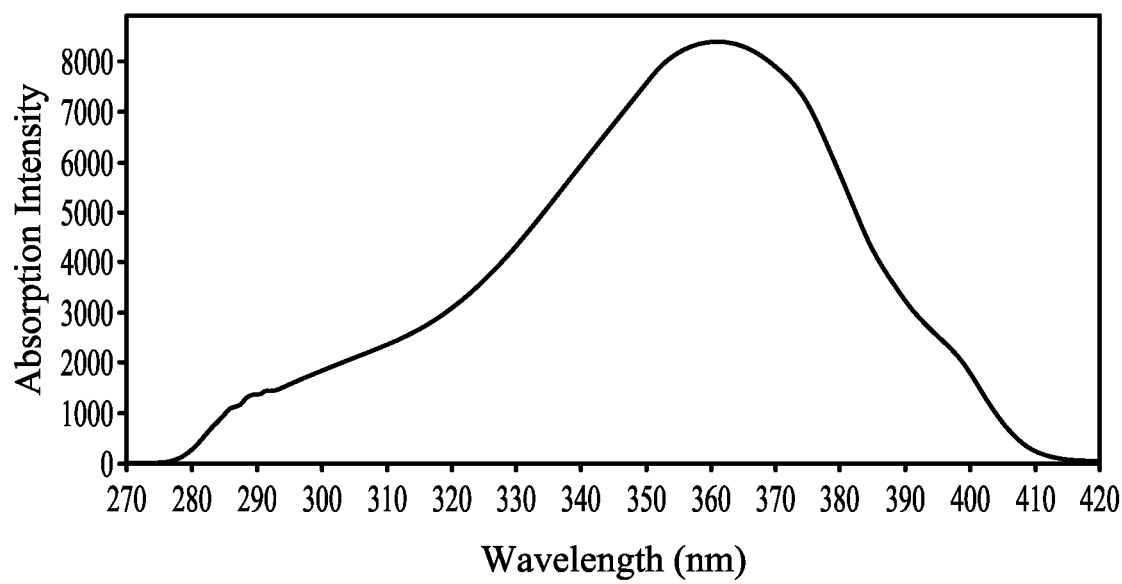
FIG. 2A is an excitation spectrum of a photoelectric conversion compound according to an embodiment of the present disclosure.
Figure 2B:
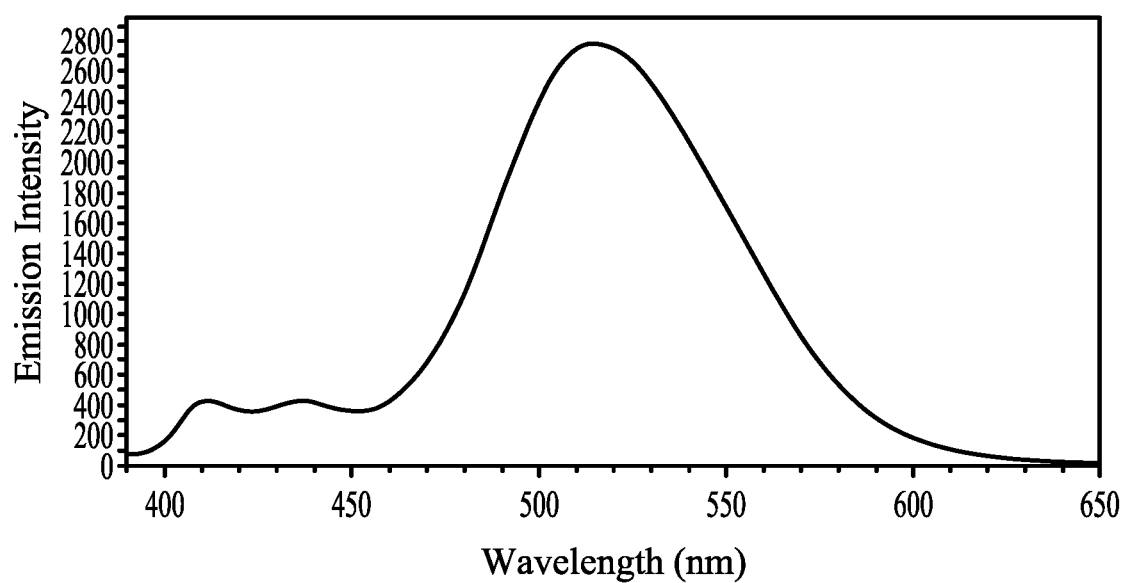
FIG. 2B is an emission spectrum of a photoelectric conversion compound according to an embodiment of the present disclosure.
Figure 3A:
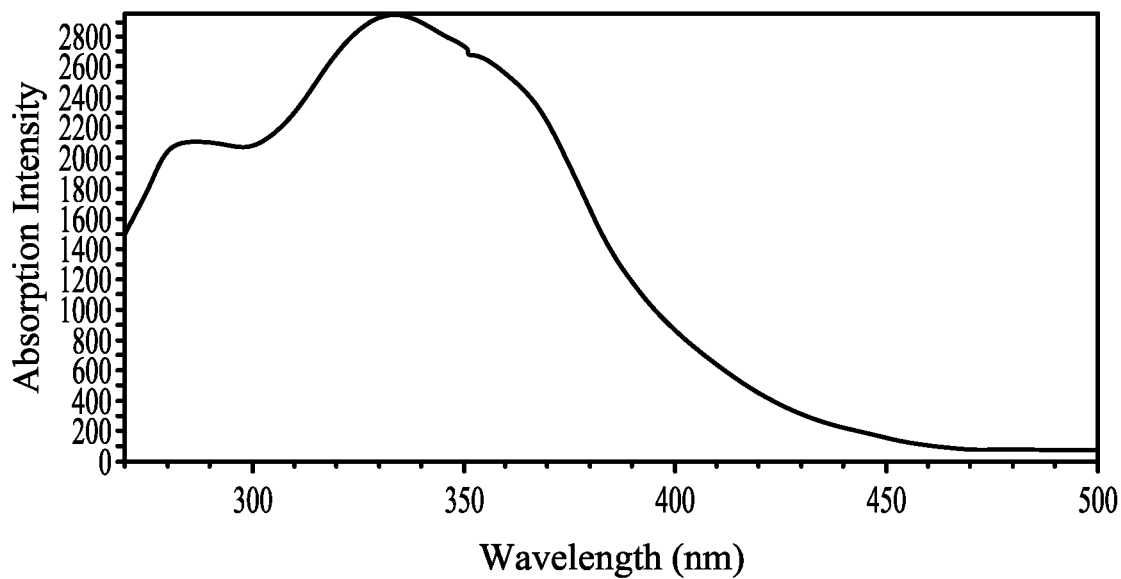
FIG. 3A is an excitation spectrum of a photoelectric conversion compound according to another embodiment of the present disclosure.
Figure 3B:
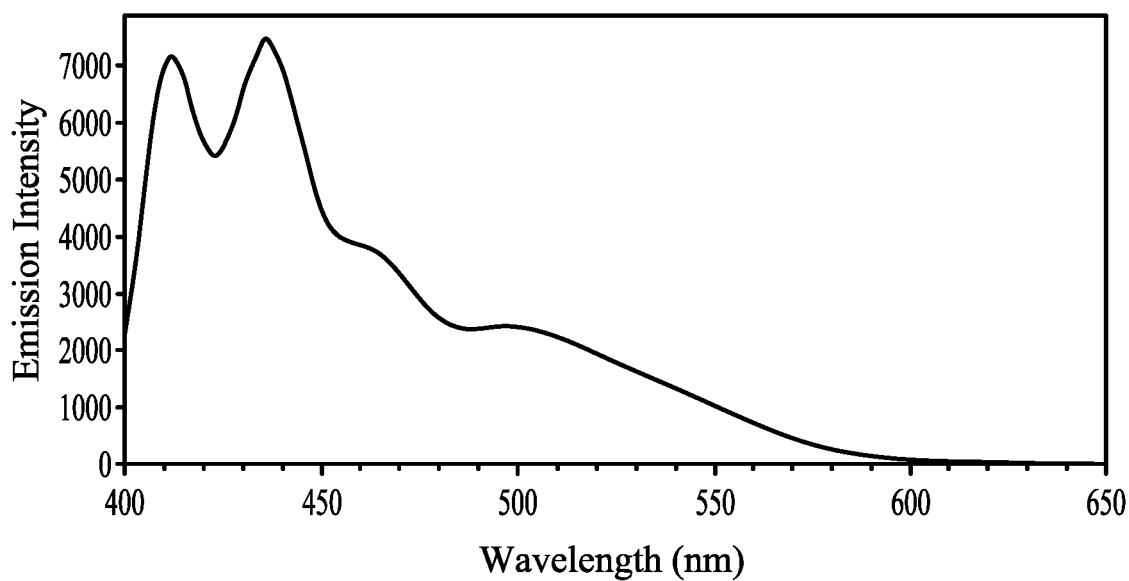
FIG. 3B is an emission spectrum of a photoelectric conversion compound according to another embodiment of the present disclosure.

The excitation and emission spectrum of photoelectric conversion compound 1 and photoelectric conversion compound 2 were measured by a fluorescence spectroscopy (Hitachi F7000 Fluorescence Spectrophotometer). FIGS. 2A and 2B are excitation spectrum and emission spectrum of the photoelectric conversion compound 1. FIGS. 3A and 3B are excitation spectrum and emission spectrum of the photoelectric conversion compound 2. According to FIGS. 2A and 2B, it can be seen that the photoelectric conversion compound 1 absorbs light with a wavelength of about 360 nm and emits light with a wavelength of about 520 nm. According to FIGS. 3A and 3B, it can be seen that the photoelectric conversion compound 2 absorbs light with a wavelength of about 330 nm and emits light with a wavelength of about 440 nm.

2. Evaluation of Melting Point

Figure 4:
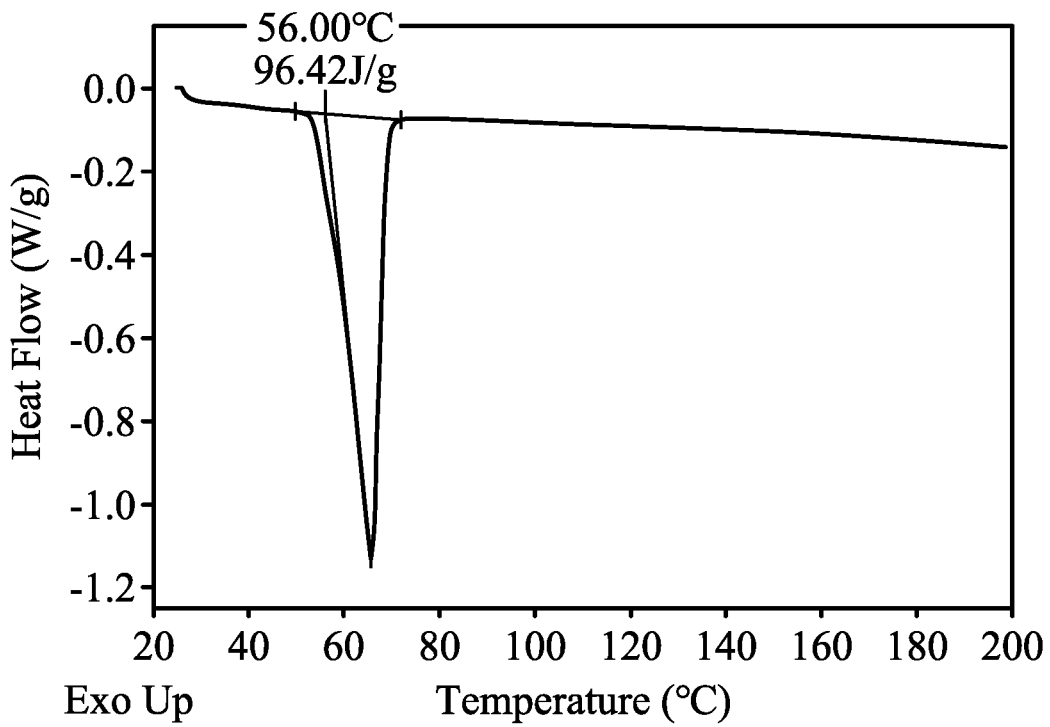
FIG. 4 is a Differential Scanning Calorimeter (DSC) spectrum of a photoelectric conversion compound according to an embodiment of the present disclosure.
Figure 5:
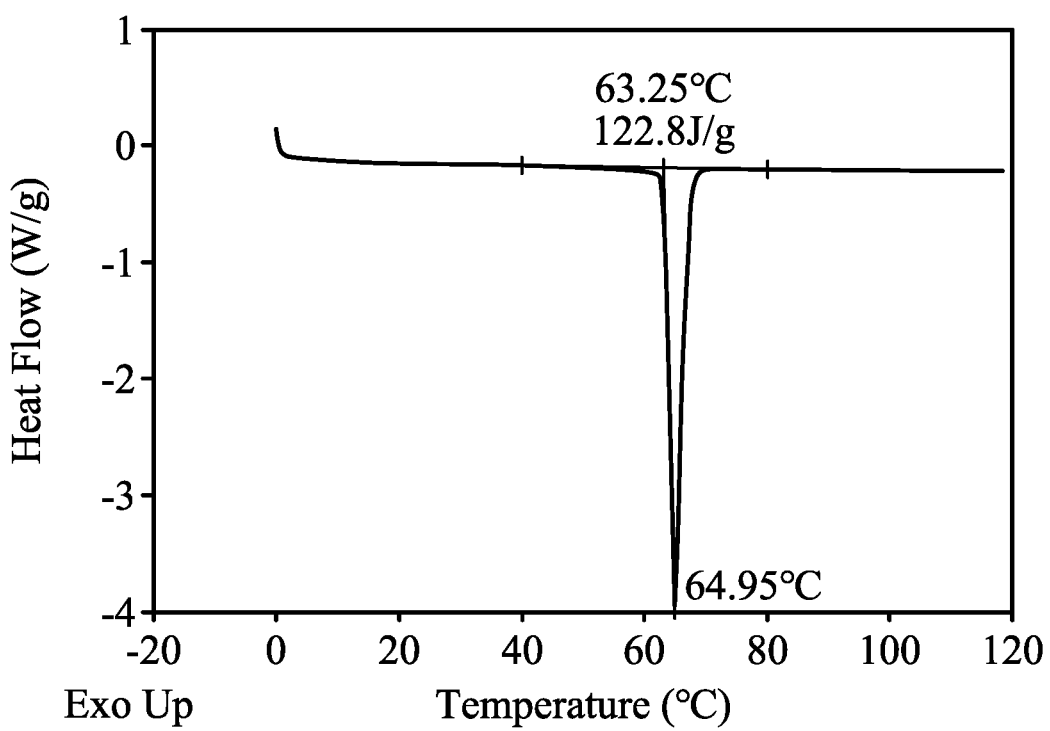
FIG. 5 is a DSC spectrum of a photoelectric conversion compound according to another embodiment of the present disclosure.

The melting points of the photoelectric conversion compound 1 and the photoelectric conversion compound 2 were measured by a differential scanning thermal analyzer (TA DSC Q10). FIG. 4 is a DSC spectrum of the photoelectric conversion compound 1. FIG. 5 is a DSC spectrum of the photoelectric conversion compound 2. According to FIG. 4, it can be seen that the melting point of the photoelectric conversion compound 1 is in the range of about 62.5-65.5° C. According to FIG. 5, it can be seen that the melting point of the photoelectric conversion compound 2 is in the range of about 63.0-67.0° C.

3. Evaluation of Water Resistance

The photoelectric conversion compound 1 and 100 ml of water were added to a sample bottle to provide a photoelectric conversion compound solution 1. The photoelectric conversion compound 2 and water were added to a container to provide a photoelectric conversion compound solution 2. The inorganic luminescent dye 1 and water were added to a container to provide a comparative solution 1. The inorganic luminescent dye 2 and water were added to a container to provide a comparative solution 2.

The photoelectric conversion compound solution 1, the photoelectric conversion compound solution 2, the comparative solution 1, and the comparative solution 2 were irradiated by a light with a wavelength of 365 nm for 10 minutes. The luminescence properties of the photoelectric conversion compound solution 1, the photoelectric conversion compound solution 2, the comparative solution 1, and the comparative solution 2 were observed at 365 nm. The luminescence properties of the photoelectric conversion compound solution 1, the photoelectric conversion compound solution 2, the comparative solution 1, and the comparative solution 2 are as shown in FIG. 6A.

The photoelectric conversion compound solution 1, the photoelectric conversion compound solution 2, the comparative solution 1, and the comparative solution 2 were oscillated by an ultrasonic oscillator (LEO-2003S 40 KHZ) for about 10 minutes. The luminescence properties of the photoelectric conversion compound solution 1, the photoelectric conversion compound solution 2, the comparative solution 1, and the comparative solution 2 were observed by naked eye. The luminescence properties of the photoelectric conversion compound solution 1, the photoelectric conversion compound solution 2, the comparative solution 1, and the comparative solution 2 after oscillating are as shown in FIG. 6B.

Figure 6A:
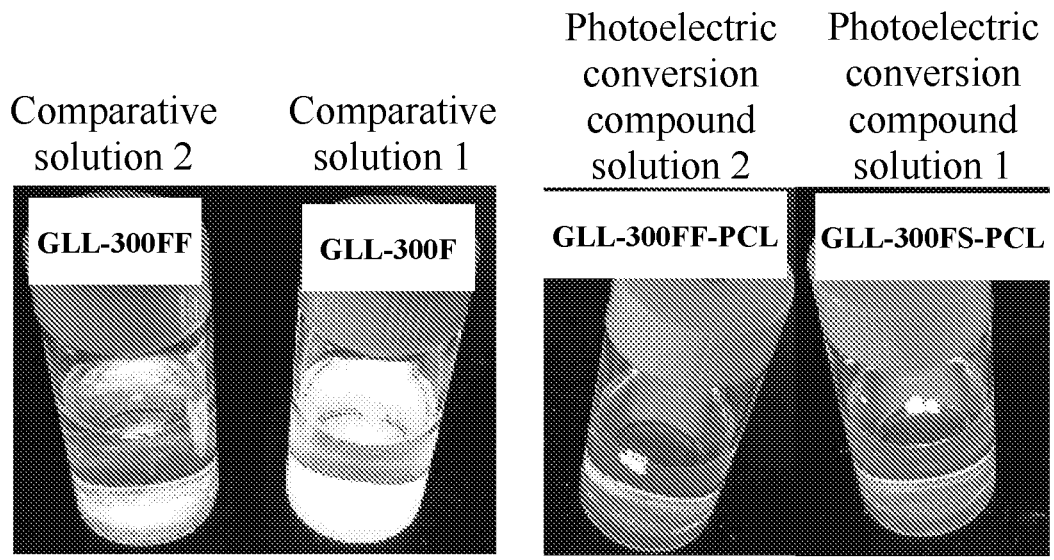
FIG. 6A is a photograph of a photoelectric conversion compound solution according to an embodiment of the present disclosure and a comparative solution before oscillating.
Figure 6B:
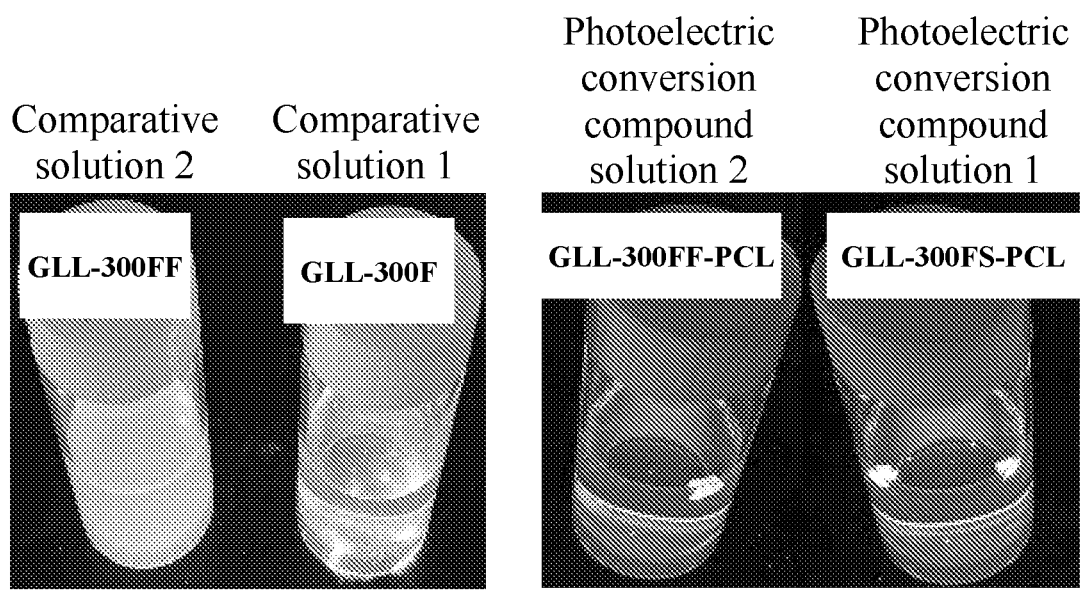
FIG. 6B is a photograph of a photoelectric conversion compound solution according to an embodiment of the present disclosure and a comparative solution after oscillating.

FIG. 6A is a photograph of the photoelectric conversion compound solution 1, the photoelectric conversion compound solution 2, the comparative solution 1, and the comparative solution 2 before oscillating. FIG. 6B is a photograph of the photoelectric conversion compound solution 1, the photoelectric conversion compound solution 2, the comparative solution 1, and the comparative solution 2 after oscillating. As can be seen in FIGS. 6A and 6B, all of the photoelectric conversion compound solutions containing the photoelectric conversion compound of the present disclosure and the comparative solutions have luminescence properties before oscillating. The brightness of the comparative solutions decreased after oscillating, which means that the inorganic luminescent dyes in the solution failed after oscillating and the inorganic luminescent dyes were not water resistant. In contrast, the brightness of the photoelectric conversion compound solution of Examples of the present disclosure is the same before and after oscillating, which means that the photoelectric conversion compound does not fail after oscillating and the photoelectric conversion compound has excellent water resistance.

The following provide a photoelectric conversion composition including the photoelectric conversion compound 1 and EVA as an example to further illustrate the advantages of the present disclosure.

1. Preparation of Example and Comparative Example

Example 1

10 g of photoelectric conversion compound 1 and 1000 g of EVA (USI Corporation, UE28) were blended and granulated by a single screw mixer (MEISEI KINZOKU MFG. CO., LTD. Model No. FRP-V32C) to produce a photoconversion composition. The temperature of the single screw mixer was set at 80° C.-85° C., and an optimal set temperature is a four stages temperature, 80° C., 85° C., 85° C., and 80° C. The photoconversion composition was pressed into a film by a press machine (GANG LING MACHINERY CO., LTD. Model No. HP-50) after granulating. In the pressing process, the press machine was preheating at 150° C. for 10 minutes first, and the photoconversion composition was pressed by the press machine at a pressure of 100 kg/cm$^2$ and a temperature of 150° C. for 10 minutes to form a 400-micron thick photoconversion layer as a packaging material of Example 1.

Example 2

30 g of photoelectric conversion compound 1 and 1000 g of EVA (USI Corporation, UE28) were blended and granulated by a single screw mixer (MEISEI KINZOKU MFG. CO., LTD. Model No. FRP-V32C) to produce a photoconversion composition. The temperature of the single screw mixer was set at 80° C.-85° C., and an optimal set temperature is a four stages temperature, 80° C., 85° C., 85° C., and 80° C. The photoconversion composition was pressed into a film by a press machine (GANG LING MACHINERY CO., LTD. Model No. HP-50) after granulating. In the pressing process, the press machine was preheating at 150° C. for 10 minutes first, and the photoconversion composition was pressed by the press machine at a pressure of 100 kg/cm$^2$ and a temperature of 150° C. for 10 minutes to form a 400-micron thick photoconversion layer as a packaging material of Example 2.

COMPARATIVE EXAMPLE 1000 g of EVA (USI Corporation, UE28) were blended and granulated by a single screw mixer (MEISEI KINZOKU MFG. CO., LTD. Model No. FRP-V32C) to produce a photoconversion composition. The temperature of the single screw mixer was set at 80° C.-85° C., and an optimal set temperature is a four stages temperature, 80° C., 85° C., 85° C., and 80° C. The photoconversion composition was pressed into a film by a press machine (GANG LING MACHINERY CO., LTD. Model No. HP-50) after granulating. In the pressing process, the press machine was preheating at 150° C. for 10 minutes first, and the photoconversion composition was pressed by the press machine at a pressure of 100 kg/cm$^2$ and a temperature of 150° C. for 10 minutes to form a 400-micron thick photoconversion layer as a packaging material of Comparative Example.

2. Evaluation of Transmittance

The transmittance of the packaging materials of Examples 1, 2, and the Comparative Example was measured by a colorimeter (NIPPON DENSHOKU INDUSTRIES, Model No. SH7000). Table 1 below shows the composition, ratio, and transmittance of the packaging materials of Examples 1, 2, and the Comparative Example.

TABLE 1

|  | Example 1 | Example 2 | Comparative Example |
|---|---|---|---|
| EVA(wt %) | 99.0 | 97.0 | 100.0 |
| Photoelectric conversion compound (wt %) | 1.0 | 3.0 | 0.0 |
| Transmittance (%) | 98.09 | 96.10 | 97.84 |

As can be seen from Table 1, the packaging materials including the photoelectric conversion compound according to the present disclosure still have high transmittance.

3. Evaluation of Luminescence Properties

Figure 7A:
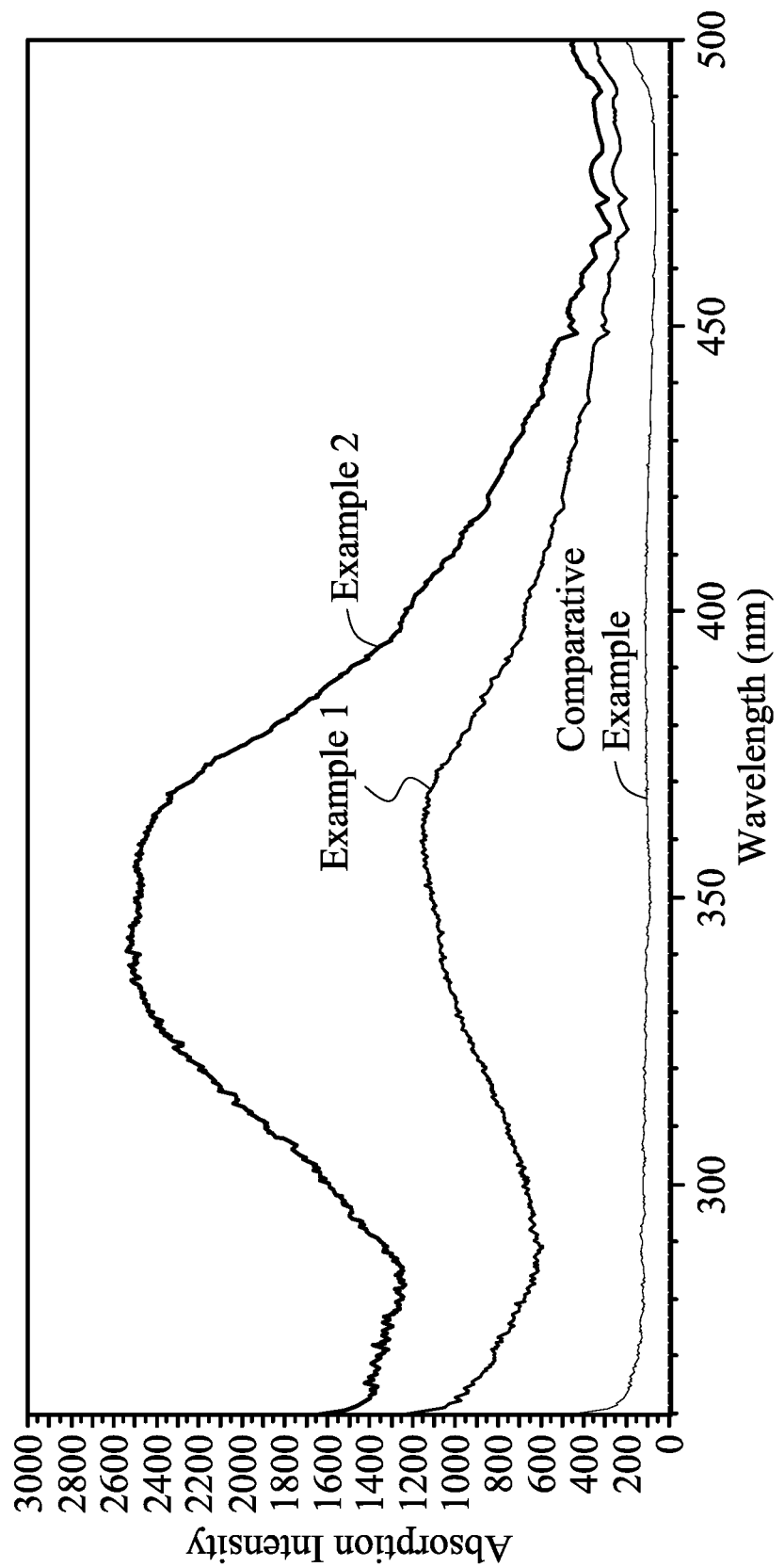
FIG. 7A is an excitation spectrum of a packaging material comprising a photoelectric conversion compound according to an embodiment of the present disclosure and a comparative packaging material.
Figure 7B:
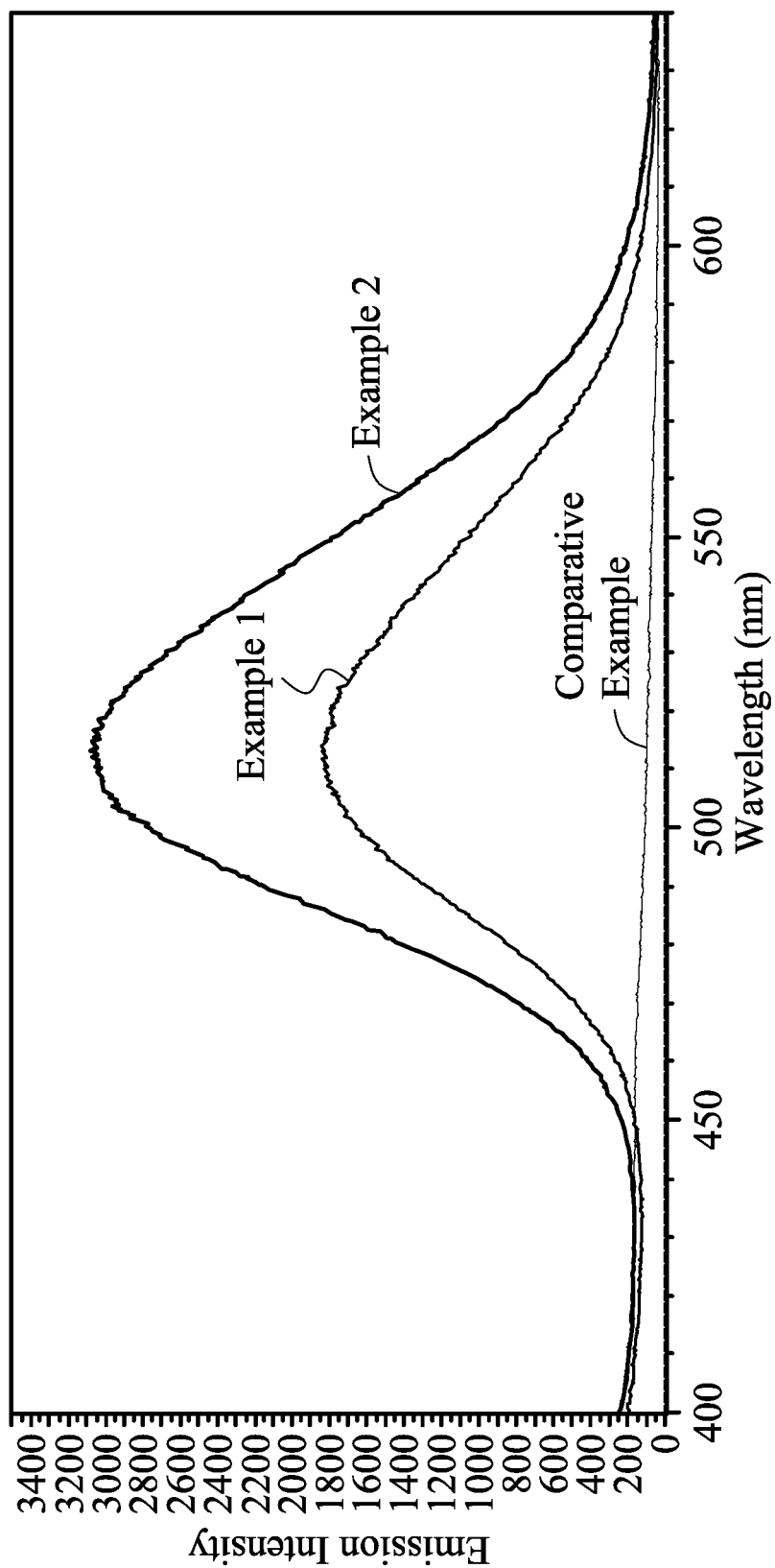
FIG. 7B is an emission spectrum of a package material comprising a photoelectric conversion compound according to an embodiment of the present disclosure and a comparative packaging material.

The excitation spectrum and emission spectrum of the packaging materials of Examples 1, 2, and the Comparative Example were measured by a fluorescence spectroscopy (Hitachi F7000 Fluorescence Spectrophotometer). FIG. 7A is an excitation spectrum of the packaging materials of Examples 1 and 2 and Comparative Example. FIG. 7B is an emission spectrum of the packaging materials of Examples 1, 2 and Comparative Example. According to FIGS. 7A and 7B, it can be seen that the packaging materials including the photoelectric conversion compounds of the present disclosure absorb light with a wavelength of about 350 nm and emit light with a wavelength of about 515 nm.

4. Evaluation of Electrical Performance

The packaging materials of Examples 1, 2, and the Comparative Example are assembled with the solar cell to provide the solar cell modules of Examples 1, 2, and the Comparative Example. A solar simulator (BERGER PSS 30 Pulsed Flasher System) was used to measure gain in power generation of the solar cell modules of Examples 1, 2, and Comparative Example. The results are shown in Table 2 below, which shows that the power generation of both Example 1 and 2 is higher than that of the comparative example. The voltage and current of the solar cell modules of Examples 1, 2, and Comparative Example were measured by irradiating the solar cell with a UV lamp (ATLAS UVA-340) at a single wavelength of 0.8 W/m². Table 3 shows that voltage and current of Example 1 and 2 are higher than that of Comparative Example. The gain in power generation of the solar cell modules of Example 1 and 2 and Comparative Example are calculated according to the voltage and current measured results of Example 1 and 2.

TABLE 2

|  | Example 1 | Example 2 | Comparative Example |
| --- | --- | --- | --- |
| Power generation of solar cell modules (watt) | 4.94 | 4.984 | 4.929 |
| Maximum power gain (%) | 0.223% | 1.116% | 0 |

TABLE 3

|  | Example 1 | Example 2 | Comparative Example |
| --- | --- | --- | --- |
| Voltage (V) | 0.502 | 0.504 | 0.437 |
| Current (mA) | 21.4 | 21.4 | 18.7 |
| Power (W) | 0.01074 | 0.01079 | 0.00817 |
| Power gain (%) | 31.460 | 31.984 | 0 |

As can be seen from Tables 2 and 3 above, compared to the solar cell module comprising the Comparative Example, the solar cell modules of Example 1 and Example 2 have better electrical properties. The above results indicate that the photovoltaic conversion compound disclosed herein can improve the luminescence efficiency of the solar cell module when used as a packaging material.

In addition, the photoelectric conversion compound of the present disclosure has a waterproof property, so that the reliability of the solar cell module can be improved when the photoelectric conversion compound is used as a packaging material for the solar cell module. Further, the disclosed photoelectric conversion compound has a luminescence property, so that the solar cell module can emit light at low illumination and at night due to light storage capability, thereby extending the performance and service life of the solar cell module.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A photoelectric conversion compound, having a structure shown in Formula (I):

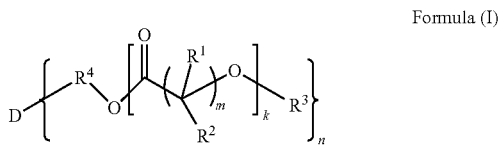

Formula (I)

wherein D represents an inorganic luminescent group;
each of $R^1$, $R^2$, and $R^3$ independently represents a hydrogen atom or a $C_1$-6 alkyl group;
$R^4$ represents a single bond or a $C_1$-6 alkylene group;
m represents an integer of 1-10;
k represents an integer of 1-1,000; and
n represents an integer of 8-10,000.

2. The photoelectric conversion compound as claimed in claim 1, wherein the photoelectric conversion compound has an ability to absorb light with a wavelength shorter than or equal to 400 nm and emit light with a wavelength longer than or equal to 400 nm.

3. The photoelectric conversion compound as claimed in claim 1, wherein the inorganic luminescent group comprises $CaAl_2O_4$:Eu,Nd, $Sr_4Al_{14}O_{25}$:Eu,Dy, or $SrAl_2O_4$:Eu, Dy.

4. The photoelectric conversion compound as claimed in claim 1, wherein the photoelectric conversion compound has a refractive index between 1 and 2.

5. The photoelectric conversion compound as claimed in claim 1, wherein the photoelectric conversion compound has a melting point between 30 and 180° C.

6. A photoelectric conversion composition, comprising the photoelectric conversion compound as claimed in claim 1.

7. The photoelectric conversion composition as claimed in claim 6, further comprising a transparent resin.

8. The photoelectric conversion composition as claimed in claim 7, wherein the transparent resin comprises a hydrogenated styrene elastomer resin, an acrylate elastomer resin, an ethylene vinyl acetate copolymer (EVA), or a combination thereof.

* * * * *